United States Patent [19]

Thomas

[11] Patent Number: 5,602,497
[45] Date of Patent: Feb. 11, 1997

[54] PRECHARGED ADIABATIC PIPELINED LOGIC

[76] Inventor: Steven D. Thomas, 3209 Conestoga Canyon Rd., Palmdale, Calif. 93550

[21] Appl. No.: 575,934

[22] Filed: Dec. 20, 1995

[51] Int. Cl.[6] ............................................. H03K 19/096
[52] U.S. Cl. .................... 326/93; 326/96; 326/98
[58] Field of Search ........................... 326/21, 93, 95–98

[56] References Cited

U.S. PATENT DOCUMENTS

| | | | |
|---|---|---|---|
| 5,422,582 | 6/1995 | Avery et al. . | |
| 5,493,240 | 2/1996 | Frank | 326/98 |
| 5,506,519 | 4/1996 | Avery et al. | 326/95 |
| 5,521,538 | 5/1996 | Dickinson | 326/93 |

OTHER PUBLICATIONS

"Low Power Digital Systems Based on Adiabtic Switching Principles" Athas et al, IEEE Trans, on VLSI Systems, Dec. 1994, pp. 398–407.
"Adiabatic Computing with the 2N–2N2D Logic Family" Kramer et al, 1994 Symposium on VLSI Digest of Technical Papers, pp. 25–26.
"Design and Analysis of a Low–Power Energy–Recovery Adder" Athas et al 1995 pp. 66–69.
"Power Dissipation Measurements on Recovered Energy Logic" Hinman et al, 1994 Symposium on VLSI Circuits Digest of Tech, Papers, p. 1920.
"An Energy Efficient CMOS Line Driver Using Adiabiatic Switching", Athas et al, IEEE, 1994, pp. 196–199.
"A Framework for Practical Low Power Digital CMOS Systems Using Adiabatic Switching Principles," Athas et al, from Internet.

*Primary Examiner*—David R. Hudspeth

[57] ABSTRACT

The present invention relates to an implementation of adiabatic circuitry using a pipeline structure which allows for simultaneous evaluation of cascaded functions, which does not require each logic function to be implemented in dual complimentary circuitry, which does not require reversible logic functions, which does not require the use of diodes to insure adiabatic current flow, and which can be implemented using MOS technology. A significant feature of the present invention relates to use of a six-phase clock cycle associated with six phases of circuit operation including, in order, a precharge phase, a precharge disable phase, an evaluate phase, a hold phase, a precharge enable phase and a guard phase. Another significant feature of the present invention relates to simultaneous evaluation of cascaded logic functions during a single phase of operation.

12 Claims, 7 Drawing Sheets

PRECHARGED ADIABATIC PIPELINED LOGIC

BACKGROUND OF THE INVENTION

1. Field of the Invention

The present invention relates generally to digital signal processing, and more particularly to processing of digital signals using a circuit suitable for adiabatic charging.

2. State of the Art

The operation of electronic devices such as amplifiers and digital logic gates using charge-controlling devices such as MOSFETs is well understood to dissipate power according to the charging and discharging of capacitance within the circuits. In conventional VLSI CMOS circuitry, a capacitive load comprised of gate capacitance and metal wiring capacitance is charged to a power supply voltage, V, and is discharged to 0 volts, thus dissipating energy=$CV^2$ as heat. In this cycle of charging and discharging a load capacitance, the only way to reduce the energy dissipation in a conventional CMOS circuit is to reduce the supply voltage, V. This increases the sensitivity of the circuit to background noise and thus increases the probability of malfunction. The well-known principal of adiabatic charging allows charge to be controlled without the controlling or controlled charge giving up their energy as heat. The adiabatic charging principal asserts that it is possible to cycle a signal from 0 to V volts through a resistance without dissipating $CV^2$ of energy, by slowing down the speed of energy transport between the power supply and the circuit's signal node. The energy advantage can be readily understood by assuming a constant current source that delivers the charge CV over a time period T. The dissipation through the channel resistance R is then:

$$E = P \times T = I^2 \times R \times T = (CV/T)^2 \times R \times T$$

This reduces to:

$$E = (RC/T) \times CV^2$$

This equation shows that it is possible to reduce the dissipation to an arbitrary degree by increasing the switching time to ever-larger values. By doing so, energy that would otherwise be dissipated in the resistance is conserved for later use, thus dramatically reducing the power required to accomplish a given logical operation. This is commonly accomplished by using a capacitor-inductor tank circuit to supply power to an adiabatic circuit, and by using inverse logic functions to alternately charge and discharge the circuit's capacitive load through the inductor-capacitor tank supply. The time, T, required to charge or discharge the capacitive load is kept long by the inductor, which acts as a constant-current source to supply charge to the load capacitance.

The advantages of adiabatic charging promised in theory have been difficult to realize in practice. Logical functions useful for digital or analog electronic systems require the cascading or pipelining of many adiabatic circuit stages to form an electronic system.

One approach to cascading or pipelining a plurality of adiabatic logic functions was discussed in an article entitled, "Low-Power Digital Systems Based on Adiabatic-Switching Principles," Athas et al, IEEE Trans. on VLSI Systems, p. 398 (Mar. 1994). This document describes an implementation of adiabatic reversible-pipeline logical functions using only reversible functions. This requirement for reversible logic adds a formidable constraint to the logic designer designing an electronic system with this method. The Athas et al document gives an example of a three-bit adder circuit which, because of the reversibility requirement, requires 20 times the number of devices and 32 times the area of a conventional adder using the same technology and laid out by the same designer. The power dissipation of the extra circuit elements required to meet the reversibility requirement can actually cause the reversible-pipeline adiabatic circuit to dissipate more power than a conventional CMOS circuit.

The pipelining technique of the Athas et al document poses significant drawbacks to the circuit designer, namely, the daunting task of designing an electronic system that consists of completely reversible logic, and also the severe penalty in the amount of circuitry and chip area required.

Another approach has been to eliminate the need for reversible pipelining by using diodes to control the direction of current flow. In U.S. Pat. No. 5,422,582, "Diode Coupled CMOS Logic Design For Quasi-Static Resistive Dissipation With Multi-output Capability", Avery et al describe a technique for pipelining adiabatic circuits where complimentary CMOS logic is used to alternately charge and discharge a capacitive load adiabatically. In the Avery et al patent, n-channel CMOS logic functions are used to discharge capacitive loads while their respective inverse p-channel CMOS logic functions are used to recharge capacitive loads with diodes controlling the flow of current for discharging and recharging. The use of diodes imposes a power penalty because the voltage drop across the diode is a constant fixed by the physical properties of the diodes: no matter how small the charging current is the power used in the diodes will always be governed by the relation $P = I \times V_t$, where $V_t$ is the diode threshold voltage. The use of dual complimentary circuitry to evaluate a single logical function also imposes a penalty of added VLSI chip area and effectively doubles the amount of power needed to generate the intended logical function.

Another approach to pipelined adiabatic circuits was proposed in the document, "Adiabatic Computing with the 2N-2N2D Logic Family", by Kramer et al (1994 Symposium on VLSI Circuits Digest of Technical Papers). The Kramer et al document proposes a precharged adiabatic circuit which relies on diodes to control the direction of current flow and uses inverse logic functions to create complimentary signal pairs. The Kramer et al pipelining scheme does not permit the output of one stage to simultaneously drive the input of another stage being evaluated during the same evaluation phase. This is a significant limitation to the designer of a pipelined adiabatic electronic system. The use of dual complimentary circuitry to evaluate a single logical function also imposes a significant penalty on VLSI chip area and doubles the power required to generate the desired function.

Accordingly, it would be highly desirable to provide an implementation of adiabatic pipelined logic which is not restricted to the use of reversible logic functions, which does not impose the power penalty of using diodes to control current flow, which does not impose the chip area penalty of dual complimentary circuitry for each function to be evaluated, yet which can allow the simultaneous evaluation of several cascaded logic functions, and which can realize the significant power savings promised by the theory of adiabatic charging.

SUMMARY OF THE INVENTION

The present invention relates to an implementation of cascadable adiabatic functions using circuitry which can be implemented using conventional MOS technology, or any other technology suitable for constructing charge-controlling switches. The present invention attains the extremely low power dissipation promised by adiabatic switching principles, and provides for pipelined electronic systems to be implemented with minimal circuitry and VLSI chip area. A significant feature of the present invention relates to use of a single clock generator to generate six or more separate sequentially occurring pulse-power/clock signals, each generated by a separate inductor-capacitor tank supply circuit. Each of the separate pulse-power/clock signals drives adiabatic circuitry to generate a desired logical function or group of functions comprising a stage in the pre-charged adiabatic pipelined circuit.

The present invention can thus provide a function implemented in CMOS, which has minimal power dissipation and requires relatively small area on integrated circuit. The present invention can provide circuitry as a stage which can be cascaded with other stages such that all of the cascaded stages can perform simultaneous computations during a single clock cycle.

Generally speaking, the foregoing features are achieved in accordance with the present invention using an apparatus for logically combining digital logic values which comprises a first functional block comprising an input means for receiving input signals to be evaluated, a first output load capacitance, means for performing a first function which allows said first output load capacitance to discharge, means to block the conductive circuit path to said first function performing means, means to enable precharging of said first output load capacitance which allows said first output load capacitance to recharge, means to block the conducting circuit path to said first precharge enable means which conducts only if said first output load cap is discharged; subsequent functional blocks with similar output load capacitance, function performing means, function blocking means, precharge enable means and precharge blocking means to said first functional block; means to connect the output of said first functional block to selected input means of said subsequent functional blocks; means to supply power-pulse signals which adiabatically discharge and recharge output load capacitances of said first and subsequent functional blocks in six distinct phases of operation including a precharge phase wherein said output load capacitances are recharged, a precharge disable phase wherein said precharge enable means are brought to a non-conducting state and wherein said function blocking means are brought to a conductive state, an evaluate phase wherein said output load capacitances are discharged according to said function performing means, a hold phase wherein said output load capacitances are held in their respective states and wherein said inputs are not allowed to change, a precharge enable phase wherein said precharge enable means are brought to a conducting state and wherein said function blocking means are brought to a non-conductive state and a guard phase wherein said output load capacitances are held in their respective states and wherein said inputs are allowed to change state; a first pipeline stage comprising any number of said functional blocks; a second pipeline stage comprising any number of said functional blocks; means to connect the output of said first pipeline stage to inputs of said second pipeline stage; means to supply pulse-power/clock signals in said six phases such that the evaluate phase of said second pipeline stage is coincident with the hold phase of said first pipeline stage.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

In an exemplary embodiment of the present invention, an arbitrary addition function with six pipelined stages will be used to illustrate the significant advantages which can be realized by the present invention. In accordance with an exemplary embodiment, the six-stage arbitrary function is separated into a carry lookahead stage followed by five one-bit adder stages, each of which is further separated into two logical functional blocks: a first function designated herein as a carry function, and a second function designated herein as a sum function. In accordance with exemplary embodiments of the present invention, six separately phased pulse-power/clock signals are generated and used to separately clock the carry function and the sum function in six cascaded stages to form a pipelined adiabatic electronic system.

Figure 1:
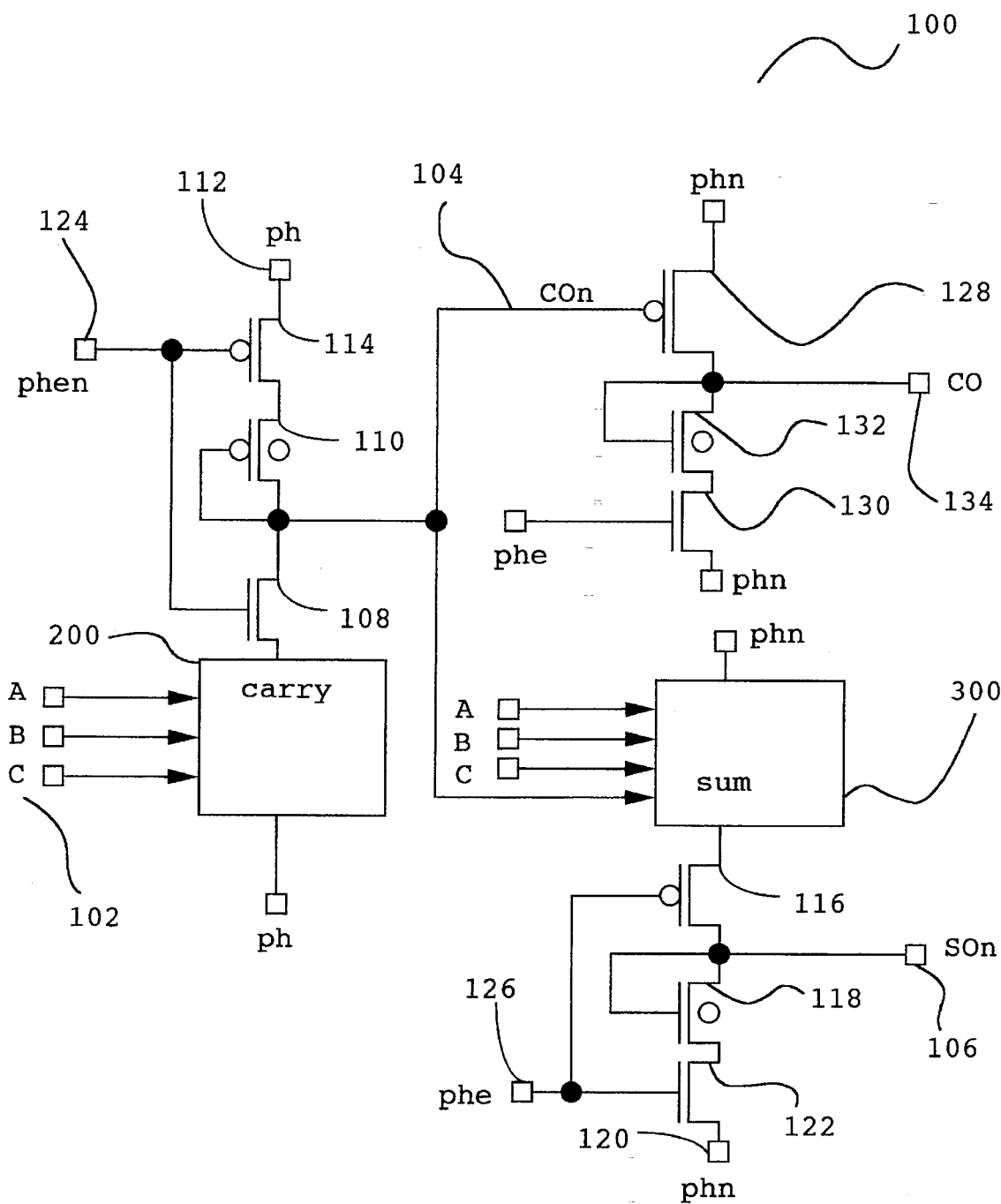
FIG. 1 shows an exemplary MOS implemented full-adder cell designed in accordance with an exemplary embodiment of the present invention.

For example, FIG. 1 shows an apparatus for logically combining digital logic values, the apparatus being generally designated as a pipeline stage 100. Where the apparatus 100 is a stage for adding input signals, it includes a means for performing a first function, generally designated as a carry function performing means 200, and a means for performing a second function, generally designated as a sum function performing means 300.

The means for performing a carry function and the means for performing a sum function receive input signals via an input means 102. As illustrated in FIG. 1, three signal inputs labeled A, B and C are provided as inputs to the carry function performing means and the sum function performing means. The carry function performing means produces an inverse carry output 104. The sum function performing means produces an inverse sum output 106.

In an exemplary embodiment, a carry function performing means is comprised of n-channel MOS transistors. Accordingly, carry function performing means 200 allows a load capacitance associated with output 104 to discharge when input means 102 are in the correct logical state and when function-blocking n-channel transistor 108 is in a conducting state. A precharge-blocking depletion-mode p-channel transistor 110 allows current to flow to recharge the load capacitance associated with output 104 only when the capacitor voltage is less than the voltage applied at terminal 112 and when precharge-enabling p-channel transistor 114 is in a conducting state. Tying the gate of transistor 110 to its drain insures it will be in a conducting state only when its drain voltage is less than its source voltage. Fabricating p-channel transistor 110 as a depletion-mode device insures that the threshold voltage is high enough that the load capacitance will be charged completely to the voltage applied at signal 112. Generally speaking, a depletion mode p-channel MOS transistor behaves as a normal enhancement-mode p-channel MOS device, only with a higher (usually positive) threshold for gate-source voltage.

Inversely, sum function performing means 300 is comprised of p-channel MOS transistors. Accordingly, sum function performing means 300 allows a load capacitance associated with output 106 to recharge when input means 102 are in the correct logical state and when function-blocking p-channel transistor 116 is in a conducting state. A precharge-blocking depletion-mode n-channel transistor 118 allows current to flow to discharge the load capacitance associated with output 106 only when the capacitor voltage is more than the voltage applied at terminal 120 and when precharge-enabling n-channel transistor 122 is in a conducting state. Tying the gate of transistor 118 to its drain insures it will be in a conducting state only when its drain voltage is higher than its source voltage. Fabricating n-channel transistor 118 as a depletion-mode device insures that the threshold voltage is low enough that the load capacitance will be discharged completely to the voltage applied at signal 120. Generally speaking, a depletion mode n-channel MOS transistor behaves as a normal enhancement-mode n-channel device, only with a lower (usually negative) threshold for gate-source voltage.

In contrast to prior art which uses diodes to control the flow of current, the use of depletion-mode MOS transistors to control current flow during precharging allows the voltage drop across source and drain to become arbitrarily small, thus reducing power dissipated during precharging. Since the depletion-mode device has its gate tied to its drain, it will be in saturation and the power dissipated is $$P = I \times V = K' \times W/L \times (V_{ds} - V_t)^2 \times V_{ds}$$

for transistor width, W, transistor length, L, and some constant K'. If the depletion mode devices are constructed such that $V_t$ is zero, dissipated power is $$P = I \times (I \times L/W/K')^{1/2}.$$

Hence, for a fixed current, I, power may be made arbitrarily small by adjusting the transistor dimensions and other parameters during manufacture.

Also in contrast to prior art which uses diodes to precharge load capacitors to the supply voltage minus $V_t$, the use of depletion-mode MOS transistors in precharging allows the load capacitors to be fully precharged to the supply voltage. This lessens the risk of noise corrupting logic values stored on capacitors during circuit operation.

In accordance with a significant feature of the present invention, normal circuit operation occurs in six distinct phases of a clock cycle wherein pulse-power/clock signals are used to evaluate logical functions. In accordance with an exemplary embodiment, pulse-power/clock signals are applied to generate inverse carry output 104 as follows.

During a precharge enabling phase of operation, transistor 114 is brought to the threshold of a conductive state when terminal 124 is slowly changed from a high logic value (i.e., logic 1) to a low logic value (i.e., logic 0) while a logic 0 is applied to terminal 112. If the capacitive load associated with output 104 is charged to logic 1, transistor 110 maintains the logic 1 level by preventing current flow. If the capacitive load associated with output 104 is charged to logic 0, transistor 110 holds output 104 at logic 0. Transistor 108 blocks current flow through carry function means 200. Hence, the previous logic value of output 104 is held. Inputs 102 must be stable during this phase to avoid logical errors and non-adiabatic operation.

During a guard phase, terminal 124 is held at logic 0 and terminal 112 is held at logic 0. This holds transistor 108 in a non-conducting state, thus isolating the capacitive load associated with output 104 from any changes in inputs 102. Output 104 remains charged at its previous logic level. Inputs 102 need not be stable during this phase to avoid logical errors and non-adiabatic operation.

During a precharge phase, terminal 112 is slowly brought from logic 0 to logic 1 while terminal 124 is held at logic 0, thus making transistor 114 conductive. If output 104 is charged to logic 1, current is blocked by transistor 110 and output 104 remains charged to logic 1. If output 104 is charged to logic 0, current flows to recharge output 104 to logic 1.

During a precharge disable phase, terminal 124 is slowly brought from logic 0 to logic 1 while terminal 112 is held at logic 1. This blocks any further precharging and creates a conductive path through transistor 108.

During an evaluate phase, terminal 112 is slowly brought from logic 1 to logic 0 while terminal 124 is held at logic 1. This allows carry function means 200 to discharge output 104 to logic 0 for certain combinations of inputs 102. Inputs 102 must be stable during this phase to avoid logical errors and non-adiabatic operation.

During a hold phase, terminal 112 is held at logic 0 and terminal 124 is held at logic 1. Output 104 is valid for subsequent pipeline stages during this phase. Inputs 102 must be stable during this phase to avoid logical errors and non-adiabatic operation.

In accordance with a significant feature of the present invention, power-pulse/clock signals applied to p-channel functional blocks are the logical inverse of power-pulse/clock signals applied to n-channel functional blocks. Hence, the six phases of normal operation are used to generate inverse sum output 106 as follows.

During the precharge enabling phase of operation, transistor 122 is brought to the threshold of a conductive state when terminal 126 is slowly changed from a low logic value (i.e., logic 0) to a high logic value (i.e., logic 1) while a logic 1 is applied to terminal 120. If the capacitive load associated with output 106 is charged to logic 0, transistor 118 maintains the logic 0 level by preventing current flow. If the capacitive load associated with output 106 is charged to logic 1, transistor 118 holds output 106 at logic 1. Transistor 116 blocks current flow through sum function means 300. Hence, the previous logic value of output 106 is held. Inputs 102 must be stable during this phase to avoid logical errors and non-adiabatic operation.

During a guard phase, terminal 126 is held at logic 1 and terminal 120 is held at logic 1. This holds transistor 116 in a non-conducting state, thus isolating the capacitive load associated with output 106 from any changes in inputs 102. Output 106 remains charged at its previous logic level. Inputs 102 need not be stable during this phase to avoid logical errors and non-adiabatic operation.

During a precharge phase, terminal 120 is slowly brought from logic 1 to logic 0 while terminal 126 is held at logic 1, thus making transistor 122 conductive. If output 106 is charged to logic 0, current is blocked by transistor 118 and output 106 remains charged to logic 0. If output 106 is charged to logic 1, current flows to discharge output 106 to logic 0.

During a precharge disable phase, terminal 126 is slowly brought from logic 1 to logic 0 while terminal 120 is held at logic 0. This blocks any further precharging and creates a conductive path through transistor 116.

During an evaluate phase, terminal 120 is slowly brought from logic 0 to logic 1 while terminal 126 is held at logic 0. This allows sum function means 300 to recharge output 106 to logic 1 for certain combinations of inputs 102. Inputs 102 must be stable during this phase to avoid logical errors and non-adiabatic operation. The inverse carry input to sum function 300 is allowed to transition from logic 1 to logic 0 during the evaluate phase since any such transition must occur very early in the evaluate phase. Such a transition is valid for correct logical operation and correct adiabatic operation of the circuit.

During a hold phase, terminal 120 is held at logic 1 and terminal 126 is held at logic 0. Output 106 is valid for subsequent pipeline stages during this phase. Inputs 102 must be stable during this phase to avoid logical errors and non-adiabatic operation.

A means for performing a logical inversion of intermediate carry signal 104 is provided via p-channel transistor 128, n-channel transistor 130 and depletion-mode n-channel transistor 132 connected to a final carry output 134. N-channel transistor 130 and depletion-mode n-channel transistor 132 act in a similar manner to transistors 122 and 118 to discharge the load capacitance associated with output 134. P-channel transistor 128 acts in a similar manner to sum function performing means 300 to either charge output 134 to logic 1 or leave output 134 discharged at logic 0 during the evaluation phase, based on the logic value of intermediate carry signal 104. No function blocking means is required since signal 104 and signal 134 are generated simultaneously by inverse power-pulse/clock signals.

Figure 2:
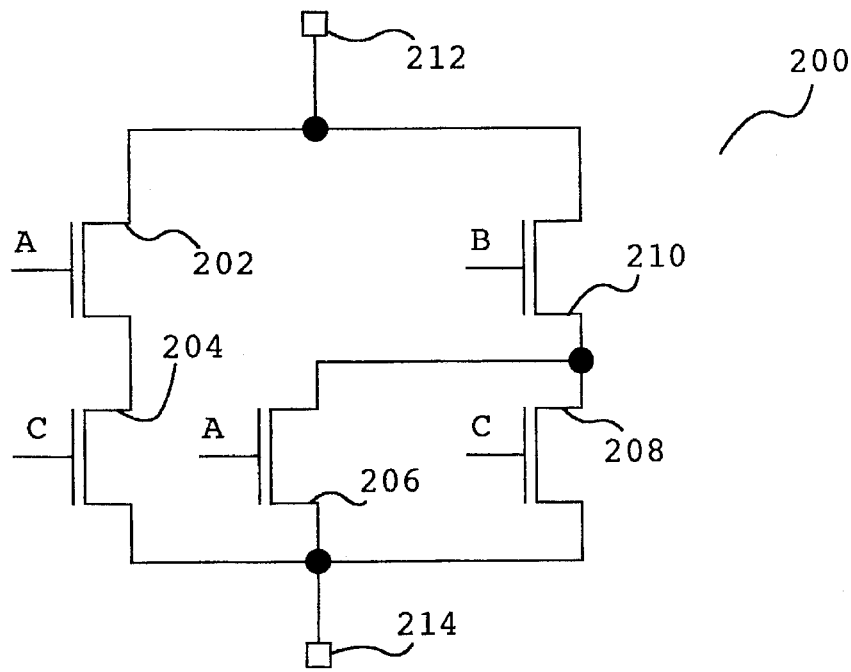
FIG. 2 shows an exemplary MOS implemented carry functional block for use with the FIG. 1 cell.

As shown in FIG. 2, the carry function performing means 200 includes various input nodes for receiving the A, B and C inputs. As shown in FIG. 2, the A and C inputs are received by a pair of serially connected n-channel CMOS transistors, 202 and 204, to provide a logic AND combination of the A and C signals. A second pair of parallel n-channel CMOS transistors, 206 and 208, also receive A and C signals respectively, and are each serially connected with a fifth n-channel CMOS transistor 210 that receives the B input signal. Given the serial and parallel relationships of the n-channel CMOS transistors 202–210, the FIG. 2 carry function performing means performs, in an exemplary embodiment, the logical function of:

$$NOT(CARRY) = NOT(A * C + B * (A + C))$$

A node labeled 212 in FIG. 2 is connected to the p-channel transistor 108 of FIG. 1, and a node 214 provides a selectively activated path for current to flow during the evaluation phase, as described with respect to FIG. 1.

Figure 3:
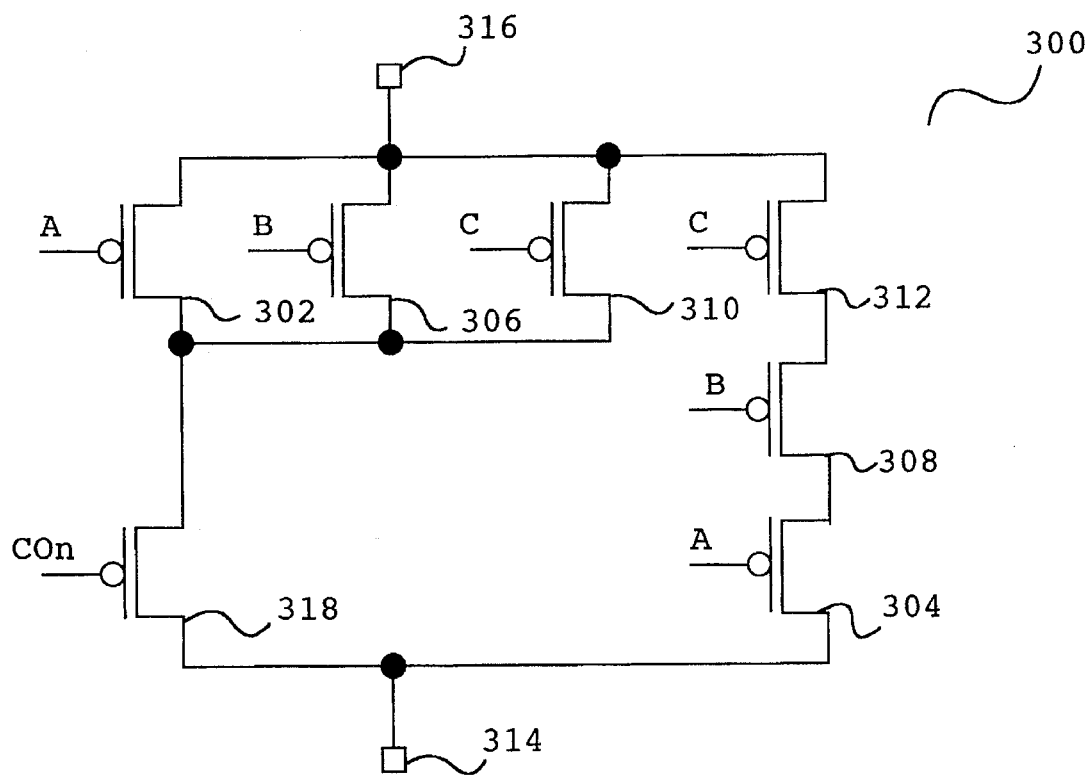
FIG. 3 shows an exemplary MOS implemented sum functional block for use with the FIG. 1 cell.

As shown in FIG. 3, the sum function performing means 300 includes various input nodes for receiving the A, B and C inputs. More particularly, the A signal is input to p-channel transistors 302 and 304. The B input signal is input to p-channel transistors 306 and 308. The C input signal is input to p-channel transistors 310 and 312.

A node labeled 314 is connected to n-channel transistor 110 of FIG. 1 during the pre-charge phase, and a node 316 provides a selectively activated path for current to flow during the evaluation phase, as described with respect to FIG. 1.

In addition to receiving the input signals A, B and C, the sum function performing means 300 also receives the intermediate carry output 104 of the carry function performing means. This signal is labeled in FIG. 3 as COn, which signal is input to n-channel transistor 318. Given the serial and parallel relationships of the p-channel CMOS transistors 302–318, the FIG. 3 sum function performing means performs, in an exemplary embodiment, the logical function of:

$$NOT(SUM) = NOT(CARRY) * (A + B + C) + A * B * C$$

Figure 4:
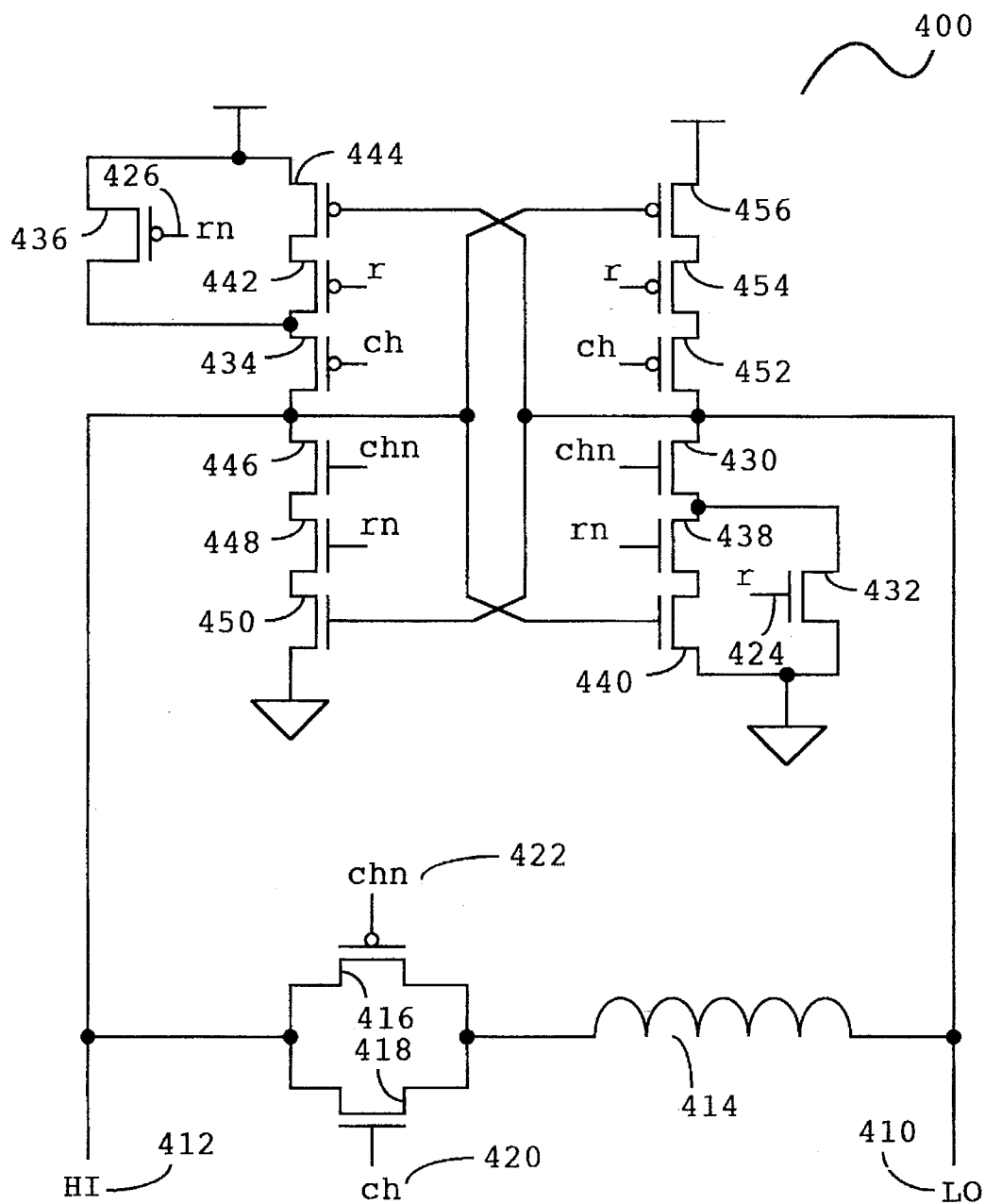
FIG. 4 shows an exemplary MOS implemented circuit which generates pulse-power/clock signals used by the FIG. 1 cell.

In accordance with an exemplary embodiment, the circuit of FIG. 4 includes means for delivering pulse-power/clock signals 410, labeled LO in FIG. 4, and 412, labeled HI in FIG. 4, to the aggregate capacitive load of a stage of a pipelined adiabatic electronic system. An inductor labeled 414 and a CMOS transmission gate, comprised of p-channel transistor 416 and n-channel transistor 418, control the current flow between two different aggregate capacitive loads. If one of the aggregate capacitive loads is charged to logic 1, and the other is charged to logic 0, then a transfer of charge from one aggregate capacitive load to the other takes place through inductor 414 and transmission gate comprised of transistors 416 and 418. When said transmission gate is in a conductive state, the rate of charge transfer is slowed by inductor 414, insuring the charge transfer conforms to adiabatic principles.

The FIG. 4 circuit receives control pulses through input means 420 and 422, labeled ch and chn, respectively, in FIG. 4. The control pulses received by input means 420 and 422 are logical compliments of each other, and are intended to change logical states during selected phases of normal system operation. A charge transfer from one aggregate capacitive load to another is initiated when signal 420 transitions from logic 0 to logic 1 and signal 422 transitions from logic 1 to logic 0. At some later time when the charge transfer is complete, signal 420 transitions from logic 1 to logic 0 and signal 422 transitions from logic 0 to logic 1, thus breaking the current path through inductor 414.

In accordance with an exemplary embodiment of the present invention, the FIG. 4 circuit receives reset pulses through input means 424 and 426, labeled r and rn, respectively, in FIG. 4. The reset pulses received by input means 424 and 426 are logical compliments of each other, and are intended to change logical states only during a reset or initialization phase of system operation. During the reset phase, input 420 is held at logic 0 and input 422 is held at logic 1 to prevent current flow through inductor 414. The reset input 424 is held at logic 1 during reset to discharge an aggregate capacitive load connected to output 410 to logic 0 through n-channel transistors 430 and 432. Similarly, the reset input 426 is held at logic 0 during reset to charge an aggregate capacitive load connected to output 412 to logic 1 through p-channel transistors 434 and 436. The significance of this reset phase is that it allows each stage in a pipelined system to be synchronized to the appropriate phase of operation as discussed in relation to FIG. 1.

During normal operation, reset input 424 is held at logic 0 and reset input 426 is held at logic 1. N-channel transistors 438 and 440 are provided to hard-drive output 410 to logic 0. P-channel transistors 442 and 444 are provided to hard-drive output 412 to logic 1.

To allow charge transfer between the two aggregate capacitive loads, control input 420 is held at logic 1 and control input 422 is held at logic 0, thus enabling current flow through inductor 414 and disabling the current flow through transistors 430 and 434. After a pre-determined time, control input 420 is returned to logic 0 and control input 422 is returned to logic 1, thus disabling current flow through inductor 414. N-channel transistors 446, 448 and 450 are provided to hard-drive output 412 to logic 0. P-channel transistors 452, 454 and 456 are provided to hard-drive output 410 to logic 1. Thus, normal operation provides for intervals wherein charge is transferred from one aggregate capacitive load to another and intervals wherein logic values are held static by hard-driving them. The length of time required for charge transfer is determined by the size of the aggregate capacitive loads and the size of inductor 414. As previously discussed, the time interval determines the amount of energy dissipated as charge is transferred.

Figure 5A:
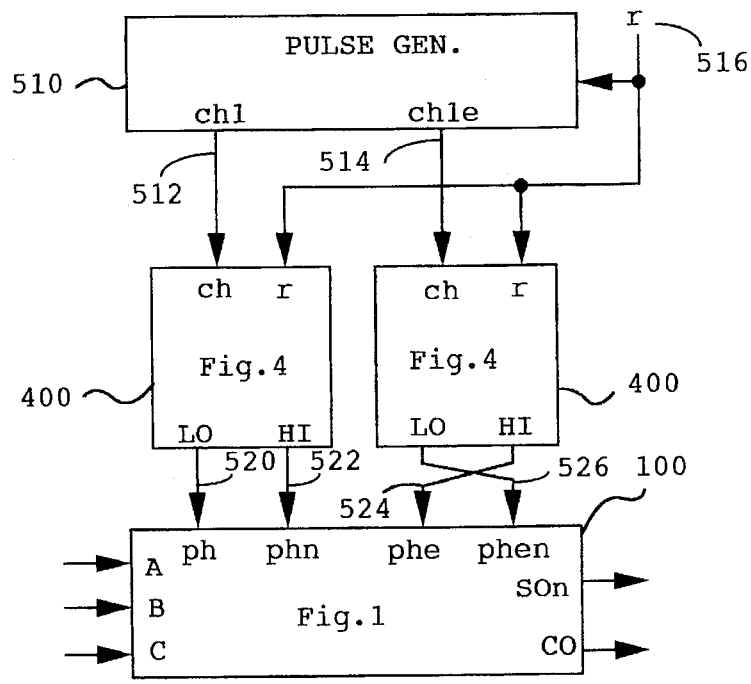
FIG. 5a illustrates the use of a pulse-power/clock generator circuit for clocking the FIG. 1 cell.

FIG. 5a illustrates how a FIG. 1 logic stage may be driven by a pair of FIG. 4 pulse-power/clock generators.

A conventional digital pulse generator means, labeled 510 in FIG. 5a, provides control pulses 512 and 514 as inputs to a pair of FIG. 4 pulse-power/clock generators. Signal 512 provides control pulses to a first FIG. 4 cell by connecting to input 420, labeled ch in FIG. 4. For simplicity, the compliment of signal 512 is not shown, but will be understood to exist and be connected to input 422, labeled chn in FIG. 4, of the first FIG. 4 cell. Signal 514 provides control pulses to a second FIG. 4 cell by connecting to input 420, labeled ch in FIG. 4. For simplicity, the compliment of signal 514 is not shown, but will be understood to exist and be connected to input 422, labeled chn in FIG. 4, of the second FIG. 4 cell. An input means, labeled 516, is provided for a reset signal to initialize pulse generator means 510 and the first and second FIG. 4 cells. Reset signal 516 is connected to input 424, labeled r in FIG. 4, in the first and second FIG. 4 cells. For simplicity, the compliment of signal 516 is not shown, but will be understood to exist and be connected to input 426, labeled rn in FIG. 4, of the first and second FIG. 4 cell.

Signal 520 connects output 410, labeled LO in FIG. 4, of the first FIG. 4 cell to input 114, labeled ph in FIG. 1, of the FIG. 1 cell. Signal 522 connects output 412, labeled HI in FIG. 4, of the first FIG. 4 cell to input 118, labeled phn in FIG. 1, of the FIG. 1 cell. Signal 524 connects output 412, labeled HI in FIG. 4, of the first FIG. 4 cell to input 116, labeled phe in FIG. 1, of the FIG. 1 cell. Signal 526 connects output 410, labeled LO in FIG. 4, of the first FIG. 4 cell to input 112, labeled phen in FIG. 1, of the FIG. 1 cell.

Figure 5B:
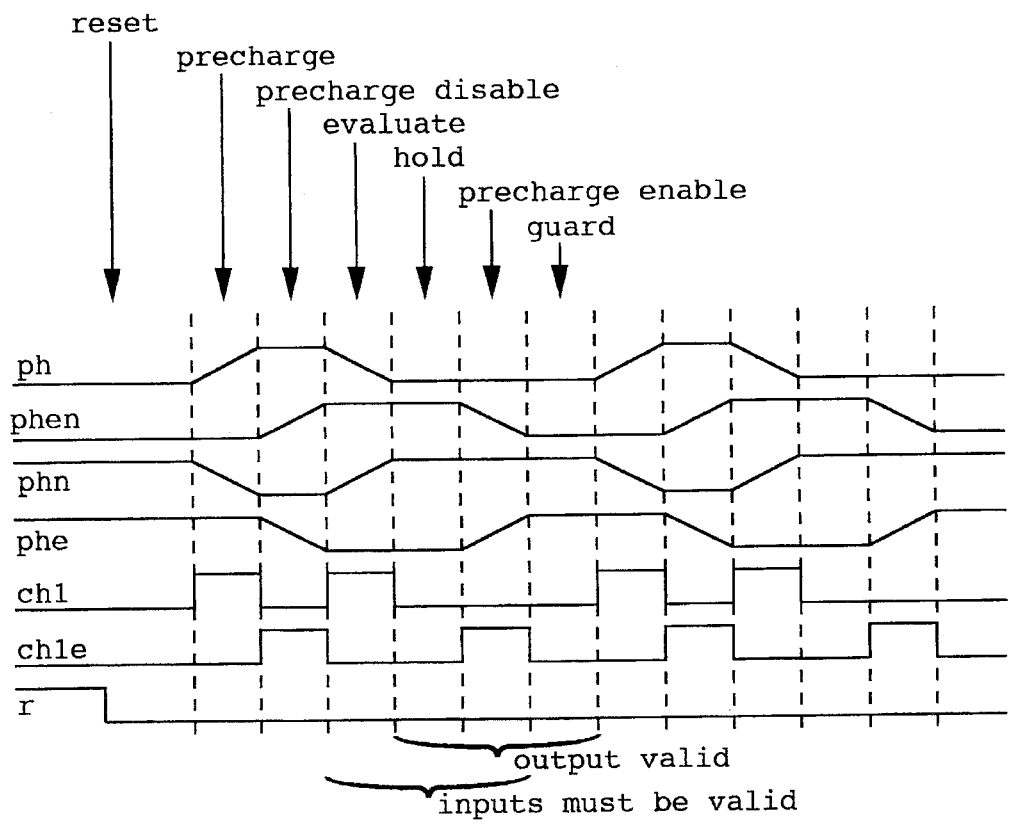
FIG. 5b shows clock waveforms associated with the FIG. 1 cell in six distinct phases of operation.

The operation of the circuit of FIG. 5a may be better understood by use of the timing diagram of FIG. 5b. It is to be understood that the operation of pulse generator means 510 is defined by the timing diagram of FIG. 5b, wherein the trace labeled ch1 in FIG. 5b is understood to define the operation of conventional circuitry generating signal 512 and the trace labeled ch1e in FIG. 5b is understood to define the operation of conventional circuitry generating signal 514. In accordance with a significant feature of the present invention, seven different phases of operation are shown in FIG. 5b: reset, precharge, precharge disable, evaluate, hold, precharge enable and guard. The reset phase is as discussed in relation to FIG. 4. The other six phases are as discussed in relation to FIG. 1. As indicated in FIG. 5b, the inputs of the FIG. 1 cell must be valid during evaluate, hold and precharge enable phases, and the outputs of the FIG. 1 cell remain valid throughout hold, precharge enable and guard phases. Hence, it is apparent that the output of a first FIG. 1 cell are valid inputs to a second FIG. 1 cell if the timing of their respective power-pulse/clock signals is such that the evaluate phase of said second FIG. 1 cell is coincident with the hold phase of said first FIG. 1 cell.

The FIG. 5a circuit is initialized by holding reset signal 516 at logic 1 as represented in FIG. 5b on the trace labeled r. Control signals 512 and 514 are understood to be logic 0 during reset. As discussed earlier, this causes output 410, labeled LO in FIG. 4, to be hard-driven to logic 0 and output 412, labeled HI in FIG. 4, to be hard-driven to logic 1. Thus the FIG. 1 cell is initialized to the guard phase, since the following conditions are true: signal 112, labeled ph in FIGS. 1 and 5b, is logic 0; signal 124, labeled phen in FIGS. 1 and 5b, is logic 0; signal 120, labeled phn in FIGS. 1 and 5b, is logic 1; and signal 126, labeled phe in FIGS. 1 and 5b, is logic 1. After the reset phase, normal operation begins with the precharge phase discussed earlier in relation to FIG. 1 and continues with all six phases in a repetitive cycle.

Figure 6:
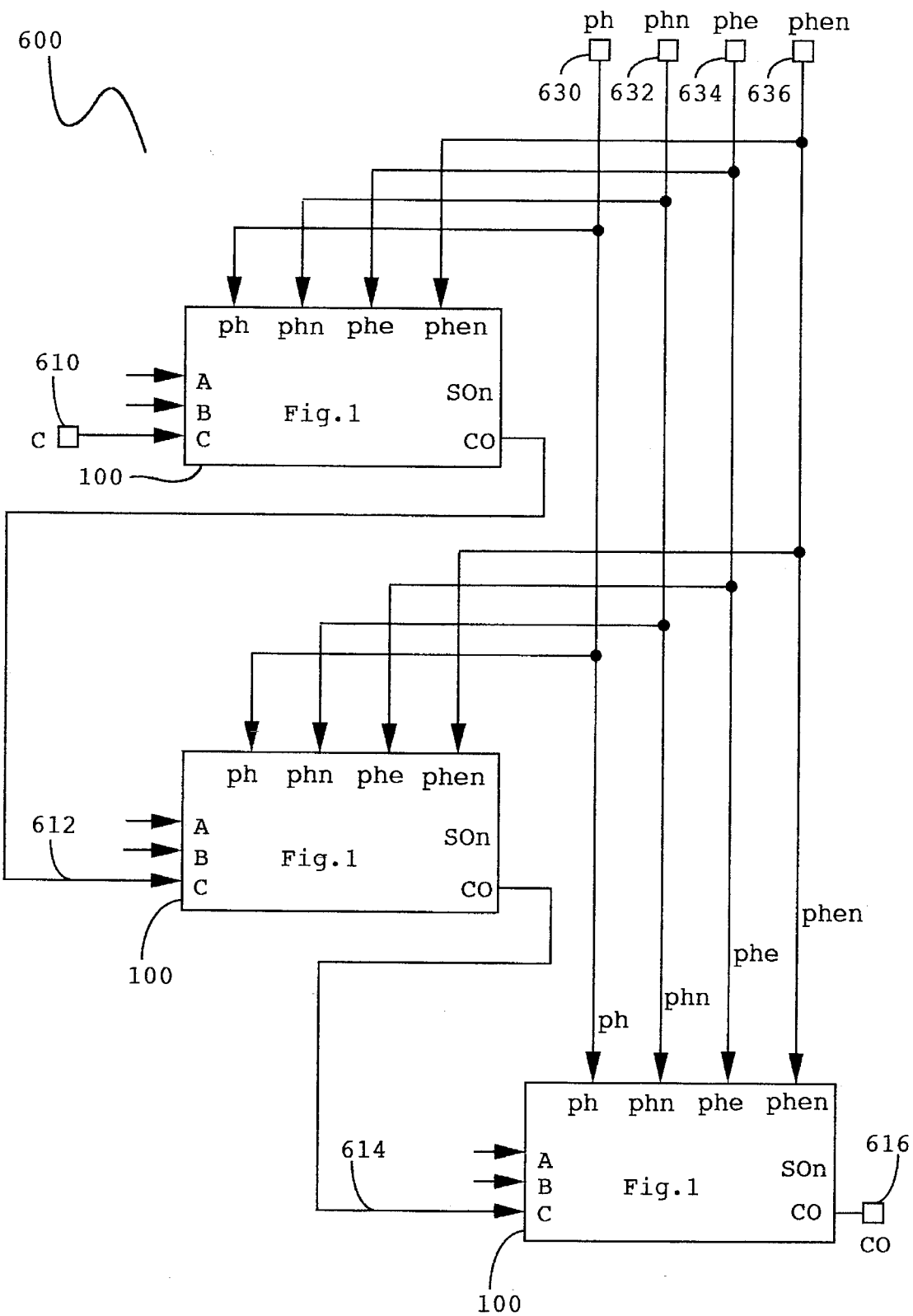
FIG. 6 shows an exemplary implementation of a circuit which includes a plurality of cascaded functional blocks driven by a single pulse-power/clock circuit to provide for simultaneous evaluation of all functional blocks.

In accordance with an exemplary embodiment of the present invention, FIG. 6 shows a plurality of the FIG. 1 cells cascaded to form a single stage in a pipelined system. An input means 610 supplies an input to a first FIG. 1 cell with signal 134, labeled CO in FIG. 1, connected via wire 612 to signal 102, labeled C in FIG. 1, of a second FIG. 1 cell. Signal 614 connects signal 134, labeled CO in FIG. 1, to signal 102, labeled C in FIG. 1, of a third FIG. 1 cell. Signal 134, labeled CO in FIG. 1, of said third FIG. 1 cell connects to output means 616. All inputs 102 of said first, second or third FIG. 1 cell not mentioned herein shall be understood to maintain stable logic values for normal operation. Signals 106, labeled SOn in FIG. 1, of said first, second and third FIG. 1 cells are unused.

In accordance with a significant feature of the present invention, all of the FIG. 1 cells shown in FIG. 6 receive the same set of power-pulse/clock signals and thus are simultaneously evaluated during the evaluate phase of normal operation. Signal 630 joins signal 112, labeled ph in FIG. 1, of each of said first, second and third FIG. 1 cells. Signal 632 joins signal 120, labeled phn in FIG. 1, of each of said first, second and third FIG. 1 cells. Signal 634 joins signal 126, labeled phe in FIG. 1, of each of said first, second and third FIG. 1 cells. Signal 636 joins signal 124, labeled phen in FIG. 1, of each of said first, second and third FIG. 1 cells. As discussed earlier, an n-channel function performing means may only accept signals which are either stable during the evaluate phase or transition only from logic 0 to logic 1 during the evaluate phase. Likewise, a p-channel function performing means may only accept signals which are either stable during the evaluate phase or transition only from logic 1 to logic 0 during the evaluate phase. Hence, for simultaneous evaluation of cascaded logical functions, n-channel function performing means may only accept outputs of p-channel function performing means, and p-channel function performing means may only accept outputs of n-channel function performing means. Thus the FIG. 6 cell provides a result at output 616 that is a cumulative carry function of said first, second and third cascaded FIG. 1 cells.

Figure 7A:
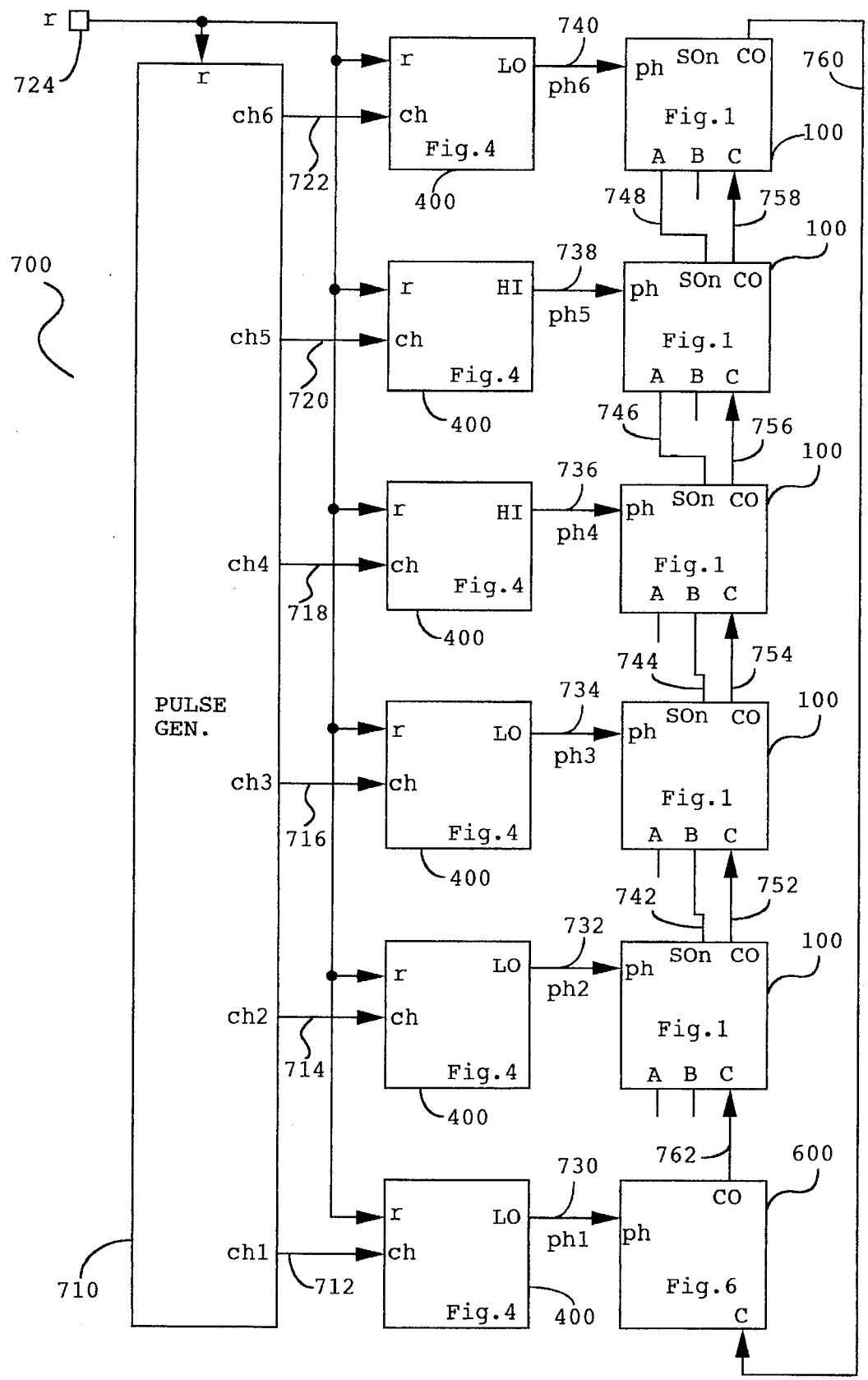
FIG. 7a shows an exemplary implementation of a circuit which includes a FIG. 6 cell and FIG. 1 cells cascaded to form an electronic system with six pipeline stages.

In accordance with an exemplary embodiment of the present invention, FIG. 7a shows six cascaded pipeline stages comprising an electronic system.

Figure 7B:
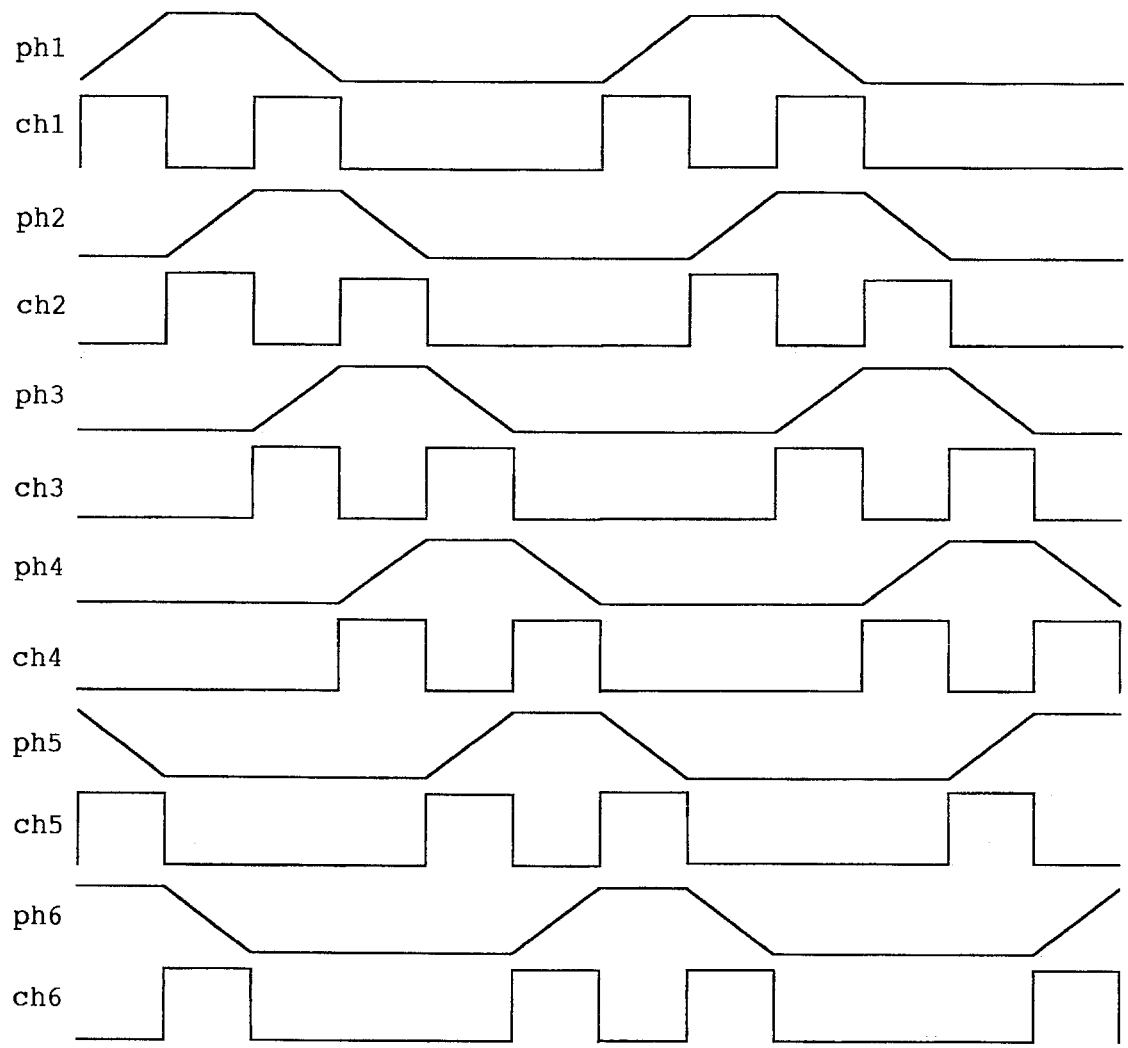
FIG. 7b shows pulse-power/clock waveforms associated with a plurality of cascaded pipeline stages.

A conventional digital pulse generator means, labeled 710 in FIG. 5a, provides control pulses 712 through 722, labeled ch1 through ch6, respectively, in FIGS. 7a and 7b. It shall be understood that the timing relationships shown in FIG. 7b define the operation of pulse generator 710. An input means, labeled 724 in FIG. 7a, provides a reset pulse to pulse generator 710 and to each of six FIG. 4 cells, thus synchronizing each stage to one of the six distinct phases of normal operation. For simplicity, only one of each pair of complementary signals is shown in FIG. 7. Signal 712 drives input 420, labeled ch in FIG. 4, of a first FIG. 4 cell. Signal 714 drives input 420, labeled ch in FIG. 4, of a second FIG. 4 cell. Signal 716 drives input 420, labeled ch in FIG. 4, of a third FIG. 4 cell. Signal 718 drives input 420, labeled ch in FIG. 4, of a fourth FIG. 4 cell. Signal 720 drives input 420, labeled ch in FIG. 4, of a fifth FIG. 4 cell. Signal 722 drives input 420, labeled ch in FIG. 4, of a sixth FIG. 4 cell. Said first FIG. 4 cell provides power-pulse/clock signals to a FIG. 6 cell. For simplicity, signals 632, 634 and 636, labeled phn, phe and phen respectively in FIG. 6 are not shown in FIG. 7a, but shall be understood to exist and to follow the timing relationship depicted in FIG. 5b. Signal 410, labeled LO in FIG. 4, of said first FIG. 4 cell drives signal 630, labeled ph in FIG. 6, of said FIG. 6 cell via signal 730. Said second FIG. 4 cell provides power-pulse/clock signals to a first FIG. 1 cell. For simplicity, signals 120, 126 and 124, labeled phn, phe and phen respectively in FIG. 1 are not shown in FIG. 7a, but shall be understood to exist and to follow the timing relationship depicted in FIG. 5b. Signal 410, labeled LO in FIG. 4, of said second FIG. 4 cell drives signal 112, labeled ph in FIG. 1, of said first FIG. 1 cell via signal 732. Said third FIG. 4 cell provides power-pulse/clock signals to a second FIG. 1 cell. Signal 410, labeled LO in FIG. 4, of said third FIG. 4 cell drives signal 112, labeled ph in FIG. 1, of said second FIG. 1 cell via signal 734. Said fourth FIG. 4 cell provides power-pulse/clock signals to a third FIG. 1 cell. Signal 412, labeled HI in FIG. 4, of said fourth FIG. 4 cell drives signal 112, labeled ph in FIG. 1, of said third FIG. 1 cell via signal 736. Said fifth FIG. 4 cell provides power-pulse/clock signals to a fourth FIG. 1 cell. Signal 412, labeled HI in FIG. 4, of said fifth FIG. 4 cell drives signal 112, labeled ph in FIG. 1, of said fourth FIG. 1 cell via signal 738. Said sixth FIG. 4 cell provides power-pulse/clock signals to a fifth FIG. 1 cell. Signal 410, labeled LO in FIG. 4, of said sixth FIG. 4 cell drives signal 112, labeled ph in FIG. 1, of said fifth FIG. 1 cell via signal 740. By the choice of LO or HI outputs of the FIG. 4 cells, it is determined that said FIG. 6 cell is initialized to the guard phase, said first FIG. 1 cell is initialized to the precharge enable phase, said second FIG. 1 cell is initialized to the hold phase, said third FIG. 1 cell is initialized to the evaluate phase, said fourth FIG. 1 cell is initialized to the precharge disable phase and said fifth FIG. 1 cell is initialized to the precharge phase. This timing relationship is maintained throughout normal operation, and is depicted in the timing diagrams of FIG. 7b. Hence, for normal operation, each stage in the pipeline is always one phase behind its previous stage.

In accordance with a significant feature of the present invention, the inputs of each stage in the pipeline are fed only by the outputs of the previous stage in the pipeline. Signal 742 connects output 106, labeled SOn in FIG. 1, of said first FIG. 1 cell to inputs 102, labeled B in FIG. 1, of said second FIG. 1 cell. Signal 744 connects output 106, labeled SOn in FIG. 1, of said second FIG. 1 cell to inputs 102, labeled B in FIG. 1, of said third FIG. 1 cell. Signal 746 connects output 106, labeled SOn in FIG. 1, of said third FIG. 1 cell to inputs 102, labeled A in FIG. 1, of fourth FIG. 1 cell. Signal 748 connects output 106, labeled SOn in FIG. 1, of said fourth FIG. 1 cell to inputs 102, labeled A in FIG. 1, of said fifth FIG. 1 cell. Signal 752 connects output 134, labeled CO in FIG. 1, of said first FIG. 1 cell to inputs 102, labeled C in FIG. 1, of said second FIG. 1 cell. Signal 754 connects output 134, labeled CO in FIG. 1, of said second FIG. 1 cell to inputs 102, labeled C in FIG. 1, of said third FIG. 1 cell. Signal 756 connects output 134, labeled CO in FIG. 1, of said third FIG. 1 cell to inputs 102, labeled C in FIG. 1, of said fourth FIG. 1 cell. Signal 758 connects output 134, labeled CO in FIG. 1, of said fourth FIG. 1 cell to inputs 102, labeled C in FIG. 1, of said fifth FIG. 1 cell. Signal 760 connects output 134, labeled CO in FIG. 1, of said fifth FIG. 1 cell to input 610, labeled C in FIG. 6, of said FIG. 6 cell. Signal 762 connects output 616, labeled CO in FIG. 6, of said FIG. 6 cell to inputs 102, labeled C in FIG. 1, of said first FIG. 1 cell. Thus, only connections between adjacent stages in the pipeline are used.

While the exemplary embodiments described herein have been discussed with respect to CMOS configurations, those skilled in the art will appreciate that other transistor technologies can be used in accordance with the present invention. It will also be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Apparatus for logically combining digital logic values comprising:

an input means for receiving input signals to be evaluated;

an output means with associated load capacitance;

means for performing a logical function on said input signals, said function performing means selectively allowing said load capacitance to discharge;

means to block the conductive circuit path to said function performing means to prevent said load capacitance from discharging;

means to enable precharging of said output load capacitance;

means to block the conducting circuit path to said precharge enable means, thereby preventing current flow when said load capacitance is already precharged; and means for providing power-pulse/clock signals, said power-pulse/clocking means adiabatically discharging and recharging said output load capacitance in six distinct phases of operation including a precharge phase wherein said output load capacitance is recharged, a precharge disable phase wherein said precharge enable means is brought to a non-conducting state and wherein said function blocking means are brought to a conductive state, an evaluate phase wherein said output load capacitance is discharged according to said inputs acting on said function performing means, a hold phase wherein said output load capacitance is held at a constant voltage and wherein said inputs are not allowed to change, a precharge enable phase wherein said precharge enable means are brought to a conducting state and wherein said function blocking means is brought to a non-conductive state and a guard phase wherein said output load capacitance is held at a constant voltage and wherein said inputs are allowed to change state.

2. An apparatus according to claim 1, wherein said input means, output means, function performing means, function blocking means, precharge enabling means and precharge blocking means constitute a functional block, and a plurality of said functional blocks are cascaded in series, each of said functional blocks receiving the same said power-pulse/clock signals for simultaneous evaluation of said function performing means.

3. An apparatus according to claim 1, wherein said input means, output means, function performing means, function blocking means, precharge enabling means and precharge blocking means constitute a functional block, and wherein one or more said functional blocks constitute a pipeline stage, and wherein a plurality of said pipeline stages are cascaded in series to produce a set of functional block outputs, each of said pipeline stages receiving a different said power-pulse/clock signal such that each said pipeline stage operates in a different phase of said six phase operation, and wherein each stage operates in said evaluate phase only while the stage previous to said stage is in said hold phase.

4. An apparatus according to claim 1, wherein said function performing means and said function blocking means are both formed with n-channel MOS transistors, said precharge enabling means are formed with p-channel MOS transistors and precharge blocking means are formed with a p-channel depletion-mode MOS transistor, said p-channel depletion-mode MOS transistor having its gate and drain terminals connected.

5. An apparatus according to claim 1, wherein said function performing means and said function blocking means are both formed with p-channel MOS transistors, said precharge enabling means are formed with n-channel MOS transistors and precharge blocking means are formed with an n-channel depletion-mode MOS transistor, said n-channel depletion-mode MOS transistor having its gate and drain terminals connected.

6. An apparatus according to claim 2, wherein one or more of said functional blocks are comprised of said function performing means formed with n-channel MOS transistors, said function blocking means formed with n-channel MOS transistors, said precharge enabling means formed with p-channel MOS transistors and precharge blocking means formed with a p-channel depletion-mode MOS transistor, said p-channel depletion-mode MOS transistor having its gate and drain terminals connected; one or more of said functional blocks are comprised of said function performing means formed with p-channel MOS transistors, said function blocking means formed with p-channel MOS transistors, said precharge enabling means formed with n-channel MOS transistors and precharge blocking means formed with an n-channel depletion-mode MOS transistor, said n-channel depletion-mode MOS transistor having its gate and drain terminals connected; and wherein outputs connected to p-channel function performing means drive selected inputs of n-channel function performing means incorporated within said functional block, and outputs connected to n-channel function performing means drive selected inputs of p-channel function performing means incorporated within said functional block.

7. An apparatus according to claim 2, wherein said function blocking means are eliminated.

8. A clock circuit for providing power-pulse/clock signals to precharged adiabatic logic cells in a pipelined electronic system, said clock circuit comprising:
   means to supply current to each stage in said pipelined system, said supply means limiting the amount of current available to adiabatically charge or discharge aggregate capacitive loads of said logic cells;
   means to block the flow of current from said supply means to said logic cells;
   means to generate separate control pulses, said control pulses controlling said current blocking means and being synchronized to allow each stage in said pipeline to operate in one of six predetermined phases of operation including a precharge phase, a precharge disable phase, an evaluate phase, a hold phase, a precharge enable phase and a guard phase; and
   means to initialize or reset said clock circuit to a desired state.

9. A clock circuit according to claim 8, wherein said control pulse generating means provides a timing relationship among said power-pulse/clock signals such that said evaluate phase of each stage in said pipeline is coincident with said hold phase of the previous stage in said pipeline.

10. A clock circuit according to claim 8, wherein said power-pulse/clock signals driving n-channel logic cells are logical compliments of said power-pulse/clock signals driving p-channel logic cells.

11. A method for clocking stages of precharged adiabatic pipelined logic, comprising the steps of:
   a) initializing or resetting said pipeline stages to known states;
   b) precharging capacitive loads in said pipeline stages;
   c) disabling any further precharging;
   d) evaluating logical functions of said pipeline stages;
   e) holding charge of said capacitive loads fixed;
   f) enabling precharging;
   g) guarding the charge of said capacitive loads from changing when inputs to said logical functions change; and
   h) repeating steps (b) through (g) for normal operation of said pipeline.

12. A method as in claim 11, wherein each said pipeline stage is evaluated only while its predecessor is being held fixed.

* * * * *